(12) United States Patent
Potter

(10) Patent No.: US 6,462,602 B1
(45) Date of Patent: Oct. 8, 2002

(54) VOLTAGE LEVEL TRANSLATOR SYSTEMS AND METHODS

(75) Inventor: Dale A. Potter, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/775,488

(22) Filed: Feb. 1, 2001

(51) Int. Cl.[7] .................................................. H03L 5/00
(52) U.S. Cl. ........................ 327/333; 327/112; 327/390
(58) Field of Search ................................. 327/390, 333, 327/589, 112; 326/63, 68, 80, 81

(56) References Cited

U.S. PATENT DOCUMENTS

| | | | | |
|---|---|---|---|---|
| 6,049,228 A | * | 4/2000 | Moon ........................... | 326/81 |
| 6,259,299 B1 | * | 7/2001 | Ryu ............................. | 327/333 |
| 6,288,590 B1 | * | 9/2001 | Sandhu ........................ | 327/318 |

\* cited by examiner

*Primary Examiner*—Terry D. Cunningham
*Assistant Examiner*—Quan Tra
(74) *Attorney, Agent, or Firm*—MacPherson Kwok Chen & Heid LLP

(57) ABSTRACT

A voltage level translator is provided that operates over a wide range of voltage levels at a fast translation speed. The voltage level translator includes an input terminal that receives an input signal and a capacitor having its first terminal coupled to the input terminal. A clamp circuit is coupled to the input terminal and to the second terminal of the capacitor and operable to provide a signal on the second terminal of the capacitor in response to a first voltage level of the input signal. A voltage source circuit is coupled to the clamp circuit and to the second terminal of the capacitor and provides a signal on the second terminal of the capacitor in response to a second voltage level of the input signal. An output buffer has a first input terminal coupled to the first terminal of the capacitor and a second input terminal coupled to the second terminal of the capacitor. The output buffer provides an output signal having a translated voltage level on its output terminal in response to signals on the first and second terminals of the capacitor.

23 Claims, 2 Drawing Sheets

VOLTAGE LEVEL TRANSLATOR SYSTEMS AND METHODS

BACKGROUND OF THE INVENTION

1. Field of the Invention

The present invention relates generally to electronic circuits and, more particularly, to a voltage level translator for electrical devices.

2. Related Art

A semiconductor device or an integrated circuit device (IC—also referred to as a chip) often requires several regulated voltages to interface among internal circuits or with external circuits or devices operating at different voltage levels. For example, an IC may require one supply voltage level for operating its internal core logic or circuits and one or more different supply voltage levels to interface input/output (I/O) signals with external devices that operate at different supply voltage levels. The voltage levels of the interface I/O signals may vary, as an example for a mixed-voltage system, from 1.4 to 5.0 volts, depending upon the selected interface.

A voltage level translator permits an IC to operate in a mixed-voltage system or have circuits operating at different voltage levels by providing the necessary translation from one voltage level to another voltage level. As an example for the mixed-voltage system, the IC's I/O interface signals, which may have strict timing parameters, are translated by the voltage level translator from one voltage level to the voltage level required by the I/O interface prior to being driven onto a bus or similar interface structure.

FIG. 2 illustrates an exemplary conventional voltage level translator 200. A drawback of conventional voltage level translators is their slow voltage level translation speed and their inability to function well over a wide range of output voltage levels that may be greater than or less than the core voltage level of the IC. As a result, there is a need for a high-speed voltage level translator, which operates over a wide range of voltage levels.

BRIEF SUMMARY OF THE INVENTION

In accordance with some embodiments of the present invention, an improved voltage level translator is provided that operates over a wide range of voltage levels at a fast translation speed. Furthermore, in some embodiments, the die area (i.e., the amount of silicon space) required by the voltage level translator is less than or equal to conventional voltage level translators.

In accordance with one embodiment of the present invention, a voltage level translator includes an input terminal that receives an input signal and a capacitor having a first terminal coupled to the input terminal and to a first terminal of an output buffer. The output buffer has its second terminal coupled to the second terminal of the capacitor. The voltage level translator further includes a clamp circuit and a voltage source circuit and may optionally include a safeguard circuit. The clamp circuit couples to the input terminal and to the second terminal of the capacitor to provide a signal on the second terminal of the capacitor in response to a first voltage level of the input signal. The voltage source circuit couples to the clamp circuit and to the second terminal of the capacitor to provide a signal on the second terminal of the capacitor in response to a second voltage level of the input signal. The safeguard circuit couples to the input terminal, to the clamp circuit, and to the voltage source circuit, and ensures that the clamp circuit and the voltage source circuit are enabled or disabled appropriately based on certain voltage levels of the input signal, regardless of the initial charge on the capacitor during power-up. The output buffer provides an output signal having a translated voltage level on its output terminal in response to signals on the first and second terminals of the capacitor.

In accordance with another embodiment of the present invention, a method includes receiving an input signal having a first and second voltage level; generating a signal having a third or fourth voltage level at a first terminal of a capacitor in response to respective first or second voltage levels of the input signal, with a second terminal of the capacitor receiving the input signal; and providing a translated output signal in response to voltage levels at the first and second terminal of the capacitor.

A more complete understanding of the present invention will be afforded to those skilled in the art, as well as a realization of additional advantages thereof, by a consideration of the following detailed description of one or more embodiments. Reference will be made to the drawings that will first be described briefly.

Figure 1:
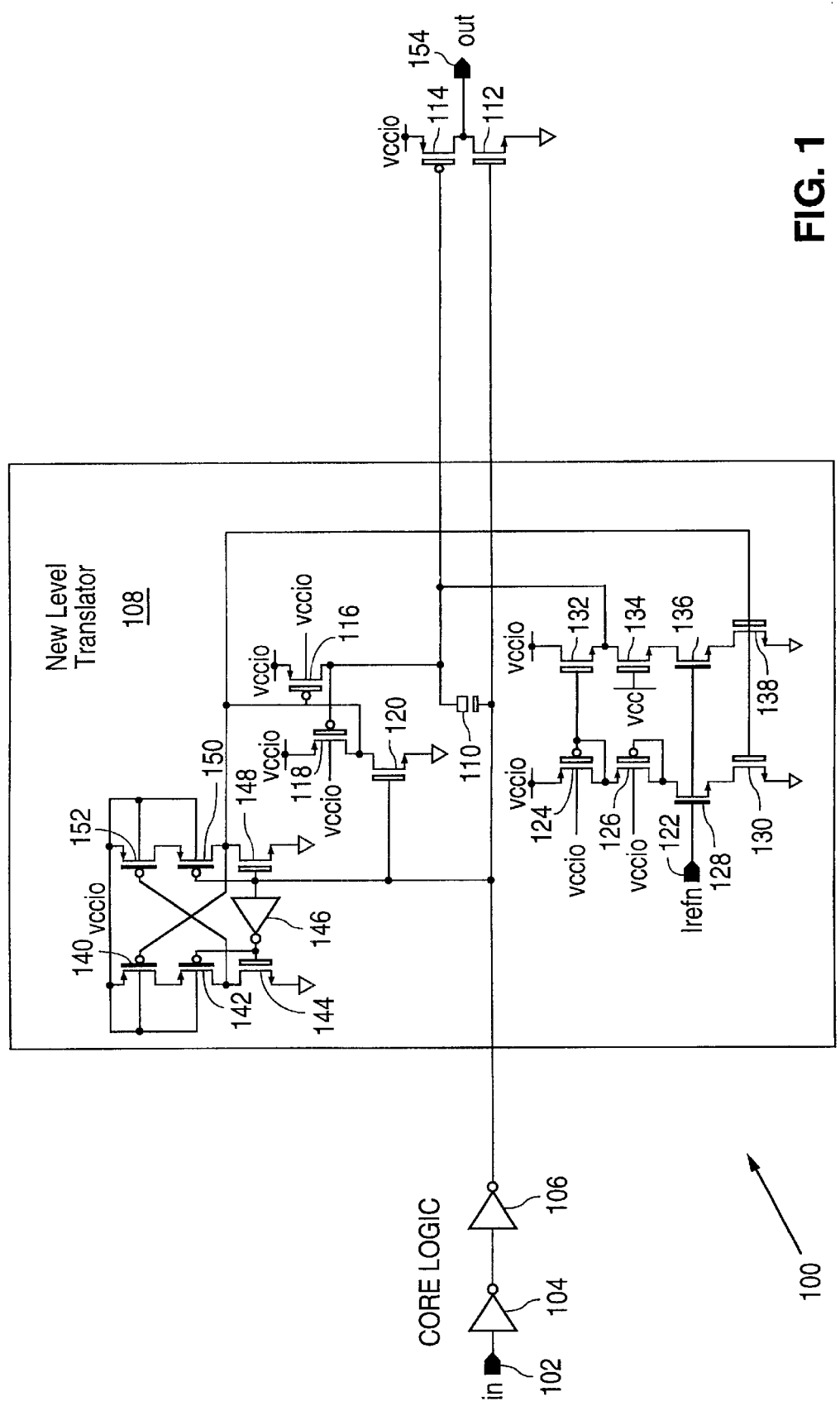
FIG. 1 is a schematic diagram illustrating a voltage level translator circuit in accordance with an embodiment of the present invention.
Figure 2:
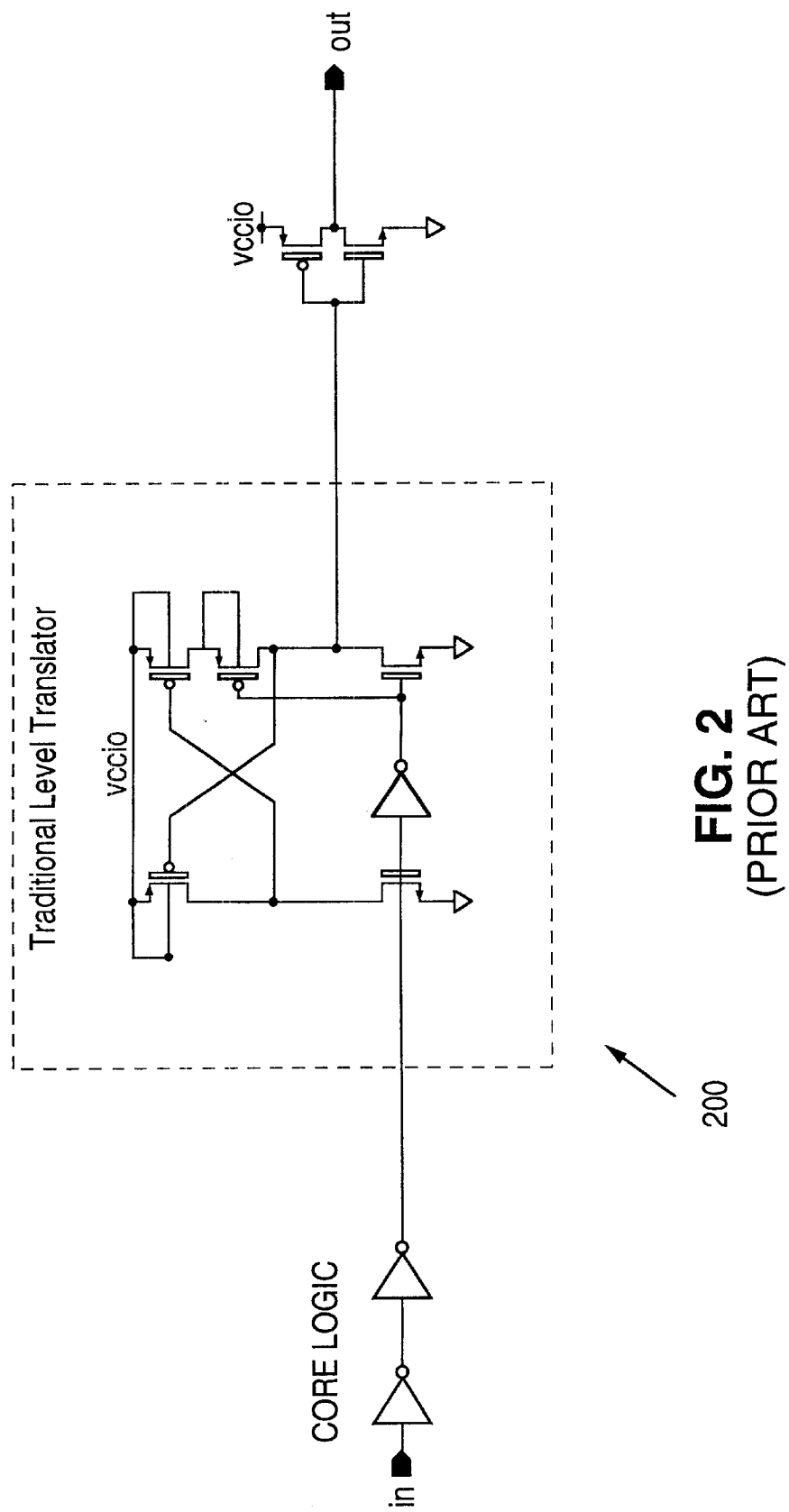
FIG. 2 is a schematic diagram illustrating a conventional voltage level translator circuit.

The various exemplary embodiments of the present invention and their advantages are best understood by referring to the detailed description that follows. It should be understood that exemplary embodiments are described herein, but that these embodiments are not limiting and that numerous modifications and variations are possible in accordance with the principles of the present invention. In the drawings, like reference numerals are used to identify like elements illustrated in one or more of the figures.

DETAILED DESCRIPTION OF THE INVENTION

FIG. 1 is a schematic diagram 100 illustrating a voltage level translator circuit 108 in accordance with an embodiment of the present invention. Schematic diagram 100 includes an input terminal 102 connected to a series of inverters 104 and 106, which function as buffers and provide an input signal (i.e., a logic "high" or logic "low" signal level) to voltage level translator circuit 108. The output terminal of inverter 106 is coupled to one terminal of capacitor 110 of voltage level translator circuit 108 and to a gate terminal of an n-type transistor 112. A second terminal of capacitor 110 is coupled to a gate terminal of a p-type transistor 114.

A reference source voltage Vccio is coupled to the source terminal of transistor 114, with the drain terminal coupled to the drain terminal of transistor 112, whose source terminal is coupled to ground. Transistors 112 and 114 form an I/O pre-buffer for voltage level translator circuit 108 and provide, at their drain terminals, an output signal at an output terminal 154. The output signal (i.e., a logic "high" or logic "low" signal level) at output terminal 154 provides the translated voltage signal, either ground or reference source voltage Vccio as described in greater detail below, depending upon the input signal (either ground or source voltage Vcc) to voltage level translator 108. Thus, voltage level translator 108, along with transistors 112 and 114, provide a circuit that translates an input signal corresponding to one voltage level (e.g., for logic "high") to an output signal corresponding to a translated voltage level at another voltage level (e.g., for logic "high") different than the voltage level of the input signal.

Capacitor 110 functions to couple the input signal at the IC's core voltage level (i.e., the signal at the output terminal of inverter 106) to the gate terminal of transistor 114, which along with transistor 112 provide, at output terminal 154, output signals at the desired translated voltage level. In operation, the voltage drop across capacitor 110 will be approximately reference source voltage Vccio minus source voltage Vcc, or greater, as described in more detail herein. Reference source voltage Vccio provides the required voltage level to translate the voltage level of source voltage Vcc (e.g., the IC's core voltage level) to the desired output voltage level.

The gate terminal of transistor 114 is coupled to a drain terminal of a p-type transistor 116 and to a gate terminal of a p-type transistor 118. Reference source voltage Vccio is coupled to the source terminal and substrate of transistor 116 and to the source terminal and substrate of transistor 118. The drain terminal of transistor 118 is coupled to the gate terminal of transistor 116 and to a drain terminal of an n-type transistor 120. Transistor 120 has its source terminal coupled to ground and its gate terminal coupled to the gate terminal of transistor 112.

Transistors 116, 118, and 120 function as a Vccio clamp to clamp the voltage level at the gate terminal of transistor 114 to reference source voltage Vccio when the voltage level of the input signal to voltage level translator circuit 108 is at a logic "high" voltage level (i.e., the voltage level of source voltage Vcc). Transistor 116 functions as the clamp device while transistors 118 and 120 function as the clamp control devices to control transistor 116. In operation, when the voltage level of the input signal provided to voltage level translator 108 is at a logic "high" signal level, transistors 116, 118, and 120 ensure that the voltage drop across capacitor 110 is approximately reference source voltage Vccio minus source voltage Vcc. In this state, transistors 116 and 120 are switched on while transistor 118 is switched off. Consequently, transistor 116 provides reference source voltage Vccio at the gate terminal of transistor 114, while the input signal provides source voltage Vcc at the gate terminal of transistor 112. Thus, transistor 112 is switched on and transistor 114 is switched off to provide a logic "low" signal level at output terminal 154.

When the voltage level of the input signal provided to voltage level translator 108 is at a logic "low" signal level, transistors 116 and 120 are switched off while transistor 118 is switched on. Consequently, transistors 116, 118, and 120 do not directly affect the voltage level at the gate terminal of transistor 114.

Gate terminals of n-type transistors 130 and 138 are coupled to the drain terminal of transistor 120. The source terminal of transistor 138 is coupled to ground while its drain terminal is coupled to a source terminal of an n-type transistor 136. The gate terminal of transistor 136 is coupled to input reference terminal 122 while its drain terminal is coupled to a source terminal of an n-type transistor 134. The gate terminal of transistor 134 is coupled to source voltage Vcc while its drain terminal is coupled to a source terminal of an n-type transistor 132 and to the gate terminal of transistor 114. The gate terminal of transistor 132 is coupled to a gate terminal and a drain terminal of a p-type transistor 124 while its drain terminal is coupled to reference source voltage Vccio.

Transistor 124 has its source terminal and substrate coupled to reference source voltage Vccio and its gate and drain terminal coupled to a source terminal of a p-type transistor 126. The substrate of transistor 126 is coupled to reference source voltage Vccio while its gate and drain terminals are coupled to a drain terminal of an n-type transistor 128. The gate terminal of transistor 128 is coupled to input reference terminal 122 while its source terminal is coupled to the drain terminal of transistor 130 whose source terminal is coupled to ground.

Transistors 124, 126, 128, and 130 along with transistors 132, 134, 136, and 138 function as a high-resistance voltage source that operates when the input signal into voltage level translator 108 is at a logic "low" signal level. Specifically, transistors 124, 126, 128, and 130 function as a voltage reference stack for transistors 132, 134, 136, and 138, which function as a voltage source stack. Consequently, this configuration maintains a voltage level at the gate of transistor 114 (i.e., the source terminal of transistor 132) of approximately reference source voltage Vccio minus the threshold voltage (Vtp) of transistor 124 minus the threshold voltage (Vtn) of transistor 132 (i.e., Vccio−Vtp−Vtn) or ground, whichever is higher.

This voltage level it is noted results in a voltage drop across capacitor 110, when the input signal is at a logic "low" signal level, that is always greater than reference source voltage Vccio minus source voltage Vcc, because source voltage Vcc is always greater than the sum of the threshold voltages from transistors 124 and 132 (i.e., Vcc>Vtp+Vtn). This larger voltage drop across capacitor 110 (relative to the voltage drop when the input signal is at a logic "high" signal level) is necessary because, during a low to high voltage level transition of the input signal to voltage level translator 108, the voltage level across the capacitor will be reduced according to the coupling ratio between coupling capacitor 110 and the input capacitance of transistor 114.

The presence of this voltage drop across capacitor 110, during a low to high voltage level transition of the input signal, ensures that there is a sufficient voltage level at the gate terminal of transistor 114 to switch off transistor 114 at the appropriate time, such as during high-speed switching. Additionally, by maintaining a known low voltage level at the gate terminal of transistor 114 when the input signal is at a logic "low" voltage level, this ensures that transistor 114 is switched on. Thus, by regulating the voltage level at the gate terminal of transistor 114 (i.e., across capacitor 110), the I/O pre-buffer formed by transistors 112 and 114 will not tristate (i.e., in a high impedance state) when it should be providing a logic "high" signal level.

In operation, when a voltage reference source (i.e., a constant current source) is provided at input reference terminal 122 for biasing of transistors 128 and 136 and a logic "low" input signal is received at the gate terminal of transistor 120, transistor 116 switches off and transistors 130 and 138 switch on to provide a voltage reference, as described herein, at the gate terminal of transistor 114. Thus, a logic "high" output signal at the translated voltage level is provided at output terminal 154, because transistor 114 is switched on while transistor 112 is switched off.

Alternatively, when a logic "high" input signal is received at the gate terminal of transistor 120, transistor 116 is switched on, which clamps the voltage at the gate terminal of transistor 114 and the source terminal of transistor 132 at approximately reference source voltage Vccio (as described herein). Transistors 130 and 138 are switched off, because of the low voltage level at the drain terminal of transistor 120, and the high-resistance voltage source of transistors 124 through 138 does not affect the voltage level at the gate terminal of transistor 114. Furthermore, because transistors 130 and 138 are switched off, the voltage reference stack and the voltage source stack do not draw current in this state. When transistors 130 and 138 are switched on, the voltage reference stack and the voltage source stack are enabled and draw a small amount of current, which adds slightly to overall power consumption.

The gate terminal of transistor 112 is further coupled to an input terminal of an inverter 146 and to gate terminals of an n-type transistor 148 and a p-type transistor 150. The source terminal of transistor 148 is coupled to ground while its drain terminal is coupled to the drain terminal of transistor 150. The source terminal of transistor 150 is coupled to the drain terminal of a p-type transistor 152. The drain terminal of transistor 148 is also coupled to the drain terminal of transistor 120 and to a gate terminal of a p-type transistor 140, whose drain terminal is coupled to a source terminal of a p-type transistor 142. Transistor 142 has its drain terminal coupled to a drain terminal of an n-type transistor 144, whose source terminal is coupled to ground. Transistors 142 and 144 have their gate terminals coupled to the output terminal of inverter 146. The drain terminal of transistor 144 is also coupled to the gate terminal of transistor 152. Reference source voltage Vccio is coupled to the source terminals of transistors 140 and 152 and also to the substrates of transistors 140, 142, 150, and 152.

Transistors 140, 142, 144, 148, 150, and 152, along with inverter 146, provide additional insurance that, under all possible conditions, the Vccio clamp (i.e., transistors 116, 118, and 120) and the high-resistance voltage source (i.e., transistors 124, 126, 128, 130, 132, 134, 136, and 138) are properly enabled or disabled according to the voltage level of the input signal entering voltage level translator 108. For example, this circuit (i.e., transistors 140, 142, 144, 148, 150, and 152, along with inverter 146, and collectively referred to herein as a safeguard circuit) guards against the remote possibility that, during power-up, voltage level translator 108 could improperly tristate the I/O pre-buffer (i.e., transistors 112 and 114) if the voltage level of the input signal started out at a logic "low" while the voltage level of the gate terminal of transistor 114 was at a logic "high." The safeguard circuit guards against this condition by ensuring that a logic "high" or a logic "low" signal level is at the gate terminal of transistor 116 when the input signal to the voltage level translator 108 is at a logic "low" or a logic "high" signal level, respectively.

It should be understood, though, that the safeguard circuit is an optional component to voltage level translator 108, which can function with or without transistors 140, 142, 144, 148, 150, and 152, along with inverter 146. The safeguard circuit is configured similarly to a conventional voltage level translator, but has generally smaller-sized or minimum-sized components. In operation, a logic "high" input signal to voltage level translator 108 causes transistors 148, 142, and 140 to switch on and transistors 144, 150, and 152 to switch off, resulting in a logic "low" voltage level at the drain terminal of transistor 148 (i.e., at the gate terminals of transistors 116, 138, and 130). A logic "low" input signal to voltage level translator 108 causes transistors 148, 142, and 140 to switch off and transistors 144, 152, and 150 to switch on, resulting in a logic "high" translated voltage level at the drain terminal of transistor 148 (i.e., at the gate terminals of transistors 116, 138, and 130). Thus, the safeguard circuit ensures that the Vccio clamp and the high-resistance voltage source are properly enabled or disabled according to the voltage level of the input signal.

It should be understood from the discussion herein that, in accordance with some embodiments of the present invention, an improved voltage level translator is provided. The voltage level translator provides high-speed voltage level translation over a wide range of voltage levels that may be less than or greater than the input voltage levels. In some embodiments, the voltage level translator is faster than conventional voltage level translators, while having less skew between the rising and falling edges and, depending upon the component size selected, requiring less die area.

Embodiments described above illustrate but do not limit the invention. It should also be understood that numerous modifications and variations are possible in accordance with the principles of the present invention. Accordingly, the scope of the invention is defined only by the following claims.

I claim:

1. A voltage level translator circuit comprising:
   an input terminal operable to receive an input signal;
   a capacitor having a first and second terminal, wherein the first terminal is coupled to the input terminal;
   a clamp circuit coupled to the input terminal and to the second terminal of the capacitor and operable to provide a signal on the second terminal of the capacitor in response to a first voltage level of the input signal;
   a voltage source circuit coupled to the clamp circuit and to the second terminal of the capacitor and operable to provide a signal on the second terminal of the capacitor in response to a second voltage level of the input signal; and
   an output buffer having a first and second input terminal and an output terminal, wherein the first input terminal is coupled to the first terminal of the capacitor and the second input terminal is coupled to the second terminal of the capacitor, the output buffer operable to provide an output signal on the output terminal in response to signals on the first and second terminals of the capacitor;
   wherein the clamp circuit comprises:
   a first transistor coupled to and operable to provide a translated voltage level signal at the second terminal of the capacitor;
   a second transistor coupled to the first transistor and to the input terminal; and
   a third transistor coupled to the first and second transistor, wherein the second and third transistors are operable to control the first transistor in response to voltage levels of the input signal and the second terminal of the capacitor.

2. The voltage level translator circuit of claim 1, further comprising a safeguard circuit coupled to the input terminal, to the clamp circuit, and to the voltage source circuit, wherein the safeguard circuit ensures that the clamp circuit and the voltage source circuit are enabled or disabled appropriately based on certain voltage levels of the input signal.

3. The voltage level translator circuit of claim 1, wherein the output signal provided by the output buffer is at a translated voltage level.

4. The voltage level translator circuit of claim 1, wherein the signal provided by the clamp circuit at the second terminal of the capacitor is at a translated voltage level.

5. The voltage level translator circuit of claim 1, wherein the output buffer comprises a first and second transistor, the first input terminal coupled to the first transistor and the second input terminal coupled to the second transistor, wherein the first transistor and the second transistor are coupled together and provide the output signal at a translated voltage level relative to a voltage level of the input signal.

6. The voltage level translator circuit of claim 1, wherein the voltage source circuit comprises:
   a voltage reference stack coupled to the clamp circuit; and
   a voltage source stack coupled to the voltage reference stack, to the clamp circuit, and to the second terminal of the capacitor, wherein the voltage reference stack and the voltage source stack are operable to provide a signal on the second terminal of the capacitor in response to a second voltage level of the input signal.

7. The voltage level translator circuit of claim 1, wherein the input signal has an upper voltage level and a lower voltage level and, in response, the output signal of the output buffer is respectively at the lower voltage level and a translated upper voltage level.

8. An integrated circuit voltage level translator comprising:
   an input terminal operable to receive an input signal;
   a capacitor having a first and second terminal, wherein the first terminal is coupled to the input terminal;
   clamp circuit coupled to the input terminal and coupled to the second terminal of the capacitor and operable to provide a signal on the second terminal of the capacitor in response to a first voltage level of the input signal;
   a voltage source circuit coupled to the clamp circuit and to the second terminal of the capacitor and operable to provide a signal on the second terminal of the capacitor in response to a second voltage level of the input signal;
   an output buffer having a first and second input terminal and an output terminal, wherein the first input terminal is coupled to the first terminal of the capacitor and the second input terminal is coupled to the second terminal of the capacitor, the output buffer operable to provide an output signal on the output terminal; and
   a safeguard circuit coupled to the input terminal, to the clamp circuit, and to the voltage source circuit, wherein the safeguard circuit ensures that the clamp circuit and the voltage source circuit are enabled or disabled appropriately based on certain voltage levels of the input signal.

9. The integrated circuit voltage level translator of claim 8, wherein the output buffer comprises a first and second transistor, the first input terminal coupled to the first transistor and the second input terminal coupled to the second transistor, wherein the first transistor and the second transistor are coupled together and provide the output signal at a translated voltage level relative to a voltage level of the input signal.

10. The integrated circuit voltage level translator of claim 8, wherein the clamp circuit comprises:
    a first transistor coupled to and operable to provide a translated voltage level signal at the second terminal of the capacitor;
    a second transistor coupled to the first transistor and to the input terminal; and
    a third transistor coupled to the first and second transistor, wherein the second and third transistors are operable to control the first transistor in response to voltage levels of the input signal and the second terminal of the capacitor.

11. The integrated circuit voltage level translator of claim 8, wherein the voltage source circuit comprises:

a voltage reference stack coupled to the clamp circuit; and
a voltage source stack coupled to the voltage reference stack, to the clamp circuit, and to the second terminal of the capacitor, wherein the voltage reference stack and the voltage source stack are operable to provide a signal on the second terminal of the capacitor in response to a second voltage level of the input signal.

12. A voltage level translator circuit comprising:
    an input terminal operable to receive an input signal;
    a capacitor having a first and second terminal, wherein the first terminal is coupled to the input terminal;
    a clamp circuit coupled to the input terminal and to the second terminal of the capacitor and operable to provide a signal on the second terminal of the capacitor in response to a first voltage level of the input signal;
    a voltage source circuit coupled to the clamp circuit and to the second terminal of the capacitor and operable to provide a signal on the second terminal of the capacitor in response to a second voltage level of the input signal; and
    an output buffer having a first and second input terminal and an output terminal, wherein the first input terminal is coupled to the first terminal of the capacitor and the second input terminal is coupled to the second terminal of the capacitor, the output buffer operable to provide an output signal on the output terminal in response to signals on the first and second terminals of the capacitor;
    wherein the voltage source circuit comprises:
        a voltage reference stack coupled to the clamp circuit; and
        a voltage source stack coupled to the voltage reference stack, to the clamp circuit, and to the second terminal of the capacitor, wherein the voltage reference stack and the voltage source stack are operable to provide a signal on the second terminal of the capacitor in response to a second voltage level of the input signal.

13. The voltage level translator circuit of claim 12, further comprising a safeguard circuit coupled to the input terminal, to the clamp circuit, and to the voltage source circuit, wherein the safeguard circuit ensures that the clamp circuit and the voltage source circuit are enabled or disabled appropriately based on certain voltage levels of the input signal.

14. The voltage level translator circuit of claim 12, wherein the output buffer comprises a first and second transistor, the first input terminal coupled to the first transistor and the second input terminal coupled to the second transistor, wherein the first transistor and the second transistor are coupled together and provide the output signal at a translated voltage level relative to a voltage level of the input signal.

15. The voltage level translator circuit of claim 12, wherein the clamp circuit comprises:
    a first transistor coupled to and operable to provide a translated voltage level signal at the second terminal of the capacitor;
    a second transistor coupled to the first transistor and to the input terminal; and
    a third transistor coupled to the first and second transistor, wherein the second and third transistors are operable to control the first transistor in response to voltage levels of the input signal and the second terminal of the capacitor.

16. A voltage level translator circuit comprising:

an input terminal operable to receive an input signal;

a capacitor having a first and second terminal, wherein the first terminal is coupled to the input terminal;

a clamp circuit coupled to the input terminal and to the second terminal of the capacitor and operable to provide a signal on the second terminal of the capacitor in response to a first voltage level of the input signal; and an output buffer having a first and second input terminal and an output terminal, wherein the first input terminal is coupled to the first terminal of the capacitor and the second input terminal is coupled to the second terminal of the capacitor, the output buffer operable to provide an output signal on the output terminal in response to signals on the first and second terminals of the capacitor;

wherein the clamp circuit comprises:

a first transistor coupled to and operable to provide a translated voltage level signal at the second terminal of the capacitor;

a second transistor coupled to the first transistor and to the input terminal; and a third transistor coupled to the first and second transistor, wherein the second and third transistors are operable to control the first transistor in response to voltage levels of the input signal and the second terminal of the capacitor.

17. The voltage level translator circuit of claim 16, further comprising a voltage source circuit coupled to the second terminal of the capacitor to provide a signal on the second terminal of the capacitor in response to a second voltage level of the input signal, and wherein the signal provided by the clamp circuit at the second terminal of the capacitor is at a translated voltage level.

18. The voltage level translator circuit of claim 17, further comprising a safeguard circuit coupled to the clamp circuit and to the voltage source circuit, wherein the safeguard circuit ensures that the clamp circuit and the voltage source circuit are enabled or disabled appropriately based on voltage levels of the input signal.

19. The voltage level translator circuit of claim 17, wherein the voltage source circuit comprises:

a voltage reference stack coupled to the clamp circuit; and a voltage source stack coupled to the voltage reference stack and to the second terminal of the capacitor, wherein the voltage reference stack and the voltage source stack provide a signal on the second terminal of the capacitor in response to a second voltage level of the input signal.

20. A voltage level translator circuit comprising:

an input terminal operable to receive an input signal;

a capacitor having a first and second terminal, wherein the first terminal is coupled to the input terminal;

a voltage source circuit coupled to the second terminal of the capacitor and operable to provide a signal on the second terminal of the capacitor in response to a second voltage level of the input signal; and an output buffer having a first and second input terminal and an output terminal, wherein the first input terminal is coupled to the first terminal of the capacitor and the second input terminal is coupled to the second terminal of the capacitor, the output buffer operable to provide an output signal on the output terminal in response to signals on the first and second terminals of the capacitor;

wherein the voltage source circuit comprises:

a voltage reference stack; and a voltage source stack coupled to the voltage reference stack and to the second terminal of the capacitor, wherein the voltage reference stack and the voltage source stack are operable to provide a signal on the second terminal of the capacitor in response to a second voltage level of the input signal.

21. The voltage level translator circuit of claim 20, further comprising a clamp circuit coupled to the second terminal of the capacitor and operable to provide a signal on the second terminal of the capacitor in response to a first voltage level of the input signal, wherein the signal provided by the clamp circuit at the second terminal of the capacitor is at a translated voltage level.

22. The voltage level translator circuit of claim 21, wherein the clamp circuit comprises:

a first transistor coupled to and operable to provide a translated voltage level signal at the second terminal of the capacitor;

a second transistor coupled to the first transistor and to the input terminal; and a third transistor coupled to the first and second transistor, wherein the second and third transistors are operable to control the first transistor in response to voltage levels of the input signal and the second terminal of the capacitor.

23. The voltage level translator circuit of claim 21, further comprising a safeguard circuit coupled to the clamp circuit and to the voltage source circuit, wherein the safeguard circuit ensures that the clamp circuit and the voltage source circuit are enabled or disabled appropriately based on certain voltage levels of the input signal.

* * * * *

UNITED STATES PATENT AND TRADEMARK OFFICE
CERTIFICATE OF CORRECTION

PATENT NO. : 6,462,602 B1
DATED : October 8, 2002
INVENTOR(S) : Potter

Page 1 of 1

It is certified that error appears in the above-identified patent and that said Letters Patent is hereby corrected as shown below:

Column 7,
Line 25, "clamp circuit" should be -- a clamp circuit --.

Signed and Sealed this

Eighteenth Day of March, 2003

JAMES E. ROGAN
*Director of the United States Patent and Trademark Office*